United States Patent [19]
Harshfield

[11] Patent Number: 5,818,749
[45] Date of Patent: Oct. 6, 1998

[54] INTEGRATED CIRCUIT MEMORY DEVICE

[75] Inventor: Steven T. Harshfield, Emmett, Id.

[73] Assignee: Micron Technology, Inc., Boise, Id.

[21] Appl. No.: 804,864

[22] Filed: Feb. 24, 1997

Related U.S. Application Data

[63] Continuation-in-part of Ser. No. 348,647, Dec. 1, 1994, Pat. No. 5,646,879, which is a continuation of Ser. No. 110,026, Aug. 20, 1993, Pat. No. 5,379,250.

[51] Int. Cl.⁶ .................................................. G11C 17/06
[52] U.S. Cl. .......................... 365/105; 365/96; 365/175; 365/225.7
[58] Field of Search ............................. 365/105, 96, 175, 365/225.7; 257/529, 530

[56] References Cited

U.S. PATENT DOCUMENTS

| | | | |
|---|---|---|---|
| 4,598,386 | 7/1986 | Roesner et al. | 365/105 |
| 5,159,661 | 10/1992 | Ovshinsky et al. | 365/105 |
| 5,296,716 | 3/1994 | Ovshinsky et al. | 257/3 |
| 5,335,219 | 8/1994 | Ovshinsky et al. | 369/288 |
| 5,379,250 | 1/1995 | Harshfield | 365/105 |
| 5,412,614 | 5/1995 | Bird | 365/105 |

FOREIGN PATENT DOCUMENTS

WO 93/04506  3/1993  WIPO ........................... H01L 45/00

OTHER PUBLICATIONS

I.S. Osborne et al., The Role of the a–Si:H Layer in Metal / a–Si:H / Metal Memory Structures, Mat. Res. Soc. Symp. Proc. vol. 258—1992 Materials Research Society, pp. 1169–1173.

*Primary Examiner*—Son T. Dinh
*Attorney, Agent, or Firm*—Fletcher, Yoder & Edwards

[57] ABSTRACT

A memory array using structure changing memory elements in a reverse biased diode array is disclosed. A memory cell is programmed and read by reverse biasing the diode to overcome the diode's breakdown voltage. The disclosed reversed biased diode array exhibits much less substrate current leakage than a similar forward biased diode array.

47 Claims, 8 Drawing Sheets

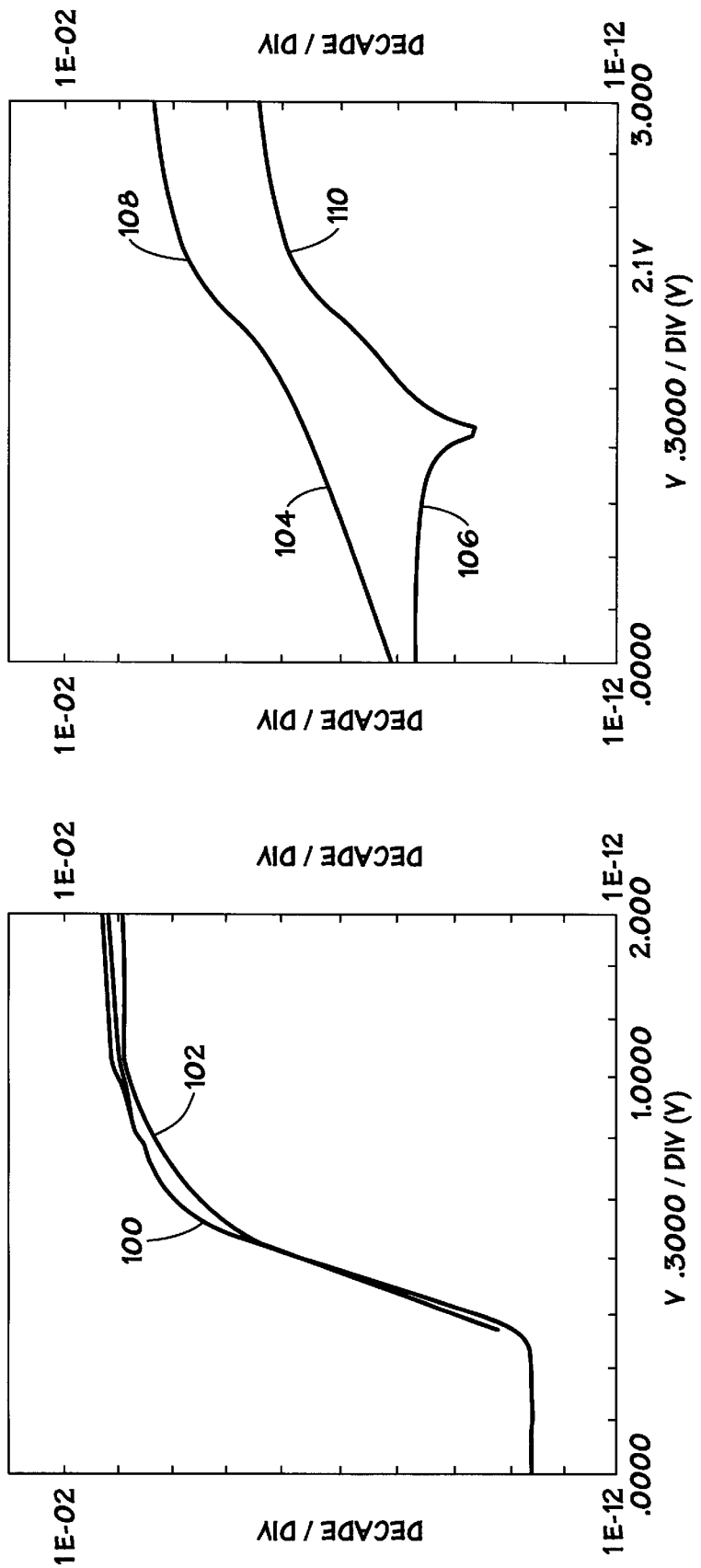

INTEGRATED CIRCUIT MEMORY DEVICE

CROSS-REFERENCE TO RELATED APPLICATIONS

This application is a continuation-in-part application of U.S. patent application Ser. No. 08/348,647, filed Dec. 1, 1994, now U.S. Pat. No. 5,646,879, which is a continuation application of U.S. patent application Ser No. 08/110,026, filed Aug. 20, 1993, and which issued as U.S. Pat. No. 5,379,250 on Jan. 3, 1995.

BACKGROUND OF THE INVENTION

1. Field of the Invention

The present invention relates generally to the field of integrated circuit fabrication and, more particularly, to the field of integrated circuit memory devices.

2. Description of the Related Art

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This program is stored in a memory device coupled to the microprocessor. Not only does the microprocessor access a memory device to retrieve the program instructions, it also stores and retrieves data created during execution of the program in one or more memory devices.

There are a variety of different memory devices available for use in microprocessor-based systems. The type of memory device chosen for a specific function within a microprocessor-based system depends largely upon what features of the memory are best suited to perform the particular function. For instance, volatile memories, such as dynamic random access memories (DRAMs), must be continually powered in order to retain their contents, but they tend to provide greater storage capability and programming options and cycles than non-volatile memories, such as read only memories (ROMs). While non-volatile memories that permit limited reprogramming exist, such as electrically erasable and programmable "ROMs," all true random access memories, i.e., those memories capable of $10^{14}$ programming cycles or more, are volatile memories. Although one time programmable read only memories and moderately reprogrammable memories serve many useful applications, a true nonvolatile random access memory (NVRAM) would be needed to surpass volatile memories in usefulness.

Although nonvolatile memories come in many forms, most nonvolatile memories have electrically programmable memory elements. These memory elements typically retain information in one of two ways. They either store an electric charge, or they retain a unique physical structure. Charge storing memories use a small to moderate electrical current to place a charge on the memory elements. By contrast, structure changing memories use a relatively large electrical current to change the physical structure of the memory elements.

Regardless of whether a memory uses charge storage memory elements or structure changing memory elements, each memory element is paired with an access device to form a memory cell. A plurality of these memory cells are typically arranged in an array of rows and columns that are addressable by the microprocessor. Most advantageously, a memory cell resides within a memory array in such a way that information can be written to it or read from it without disturbing the other cells in the array. In the case of a ferro electric RAM (FERAM) (an example of a memory having charge storage memory elements), a small capacitor is coupled to an access transistor. The access transistor is coupled to a row line and a column line of the array so that it can be selectively turned on or off depending upon the voltages found on the row line and the column line. When the access transistor is turned on, information in the form of a charge may be written to or read from the capacitor. In the case of a chalcogenide memory (an example of a memory having structure changing memory elements), a chalcogenide memory element is typically coupled in series with a diode. The crystal structure of the chalcogenide memory element is changed by the application of a relatively large electrical current. This change in structure alters the resistance of the chalcogenide memory element. Thereafter, a smaller current may be passed through the diode and chalcogenide memory element to measure the resistance of the element and, thus, determine the information stored within the memory cell.

It is desirable to create memory devices that include one or more arrays of densely packed memory cells to maximize the storage capability for a given area. As the density of memory arrays increases, the cost of the memory tends to decrease while the speed of the memory tends to increase. Various schemes are currently known for producing densely packed memory arrays having charge storing memory elements. Because charge storing memory elements typically require a relatively small amount of electrical current, these memories provide adequate power dissipation while maintaining a densely packed array. However, the relatively high current used to program memories having structure changing memory elements tends to limit the density at which such memory arrays can be produced. If the high current access device and its isolation area are made large enough to provide adequate current control, the density of the array tends to decrease. Alternatively, if the high current access device and its isolation area are made small to provide a densely packed array, current control and power dissipation suffers.

The use of structure changing memory elements in a forward biased diode array comes as close as any currently known memory that uses structure changing memory elements to providing a memory array having good density along with good current control. In a forward biased diode array, each structure changing memory element, such as a chalcogenide resistor or an antifuse, is coupled to a diode that acts as an access device. Such an array can be built on a silicon monolithic substrate with a competitive cell density if the diodes are placed within a common semiconductor well. Unfortunately, the diodes inherently leak current to the common well, which tends to cause latch up failure. Latch up failure occurs because the leaking current basically turns the densely packed diodes into bipolar junction transistors. These transistors turn on due to the leaking current and, thus, draw even more current into the common well. This additional current creates and turns on even more transistors, so that latch up proceeds much like a domino effect.

To avoid the latch up problem, the density of the array is decreased, or each memory cell is provided with an individual semiconductor well. Either way, the cost of the memory increases and, thus, reduces the ability of the forward biased diode array memory to compete with other memories.

The present invention may address one or more of the problems set forth above.

SUMMARY OF THE INVENTION

In accordance with one aspect of the present invention, there is provided a memory cell for use in an integrated circuit memory device. The memory cell includes a memory element and a diode that is coupled to the memory element. The diode has a breakdown voltage. The memory element is programmable in response to a programming voltage that has a magnitude greater than the breakdown voltage being applied across the memory element in the diode. The memory element is readable in response to a read voltage that has a magnitude greater than the breakdown voltage and less than the programming voltage being applied across the memory element and the diode.

In accordance with another aspect of the present invention, there is provided a memory cell for use in an integrated circuit memory device. The memory cell includes a memory element. A diode is coupled to the memory element for conducting a reverse current when the diode is reversed biased. The memory element is programmable in response to the reverse current having a first magnitude, and the memory element is readable in response to the reverse current having a second magnitude.

In accordance with a still another aspect of the present invention, there is provided a memory cell for use in an integrated circuit. The memory cell includes a memory element and a diode that is coupled to the memory element. The memory element is programmable in response to a programming voltage being applied across the memory element and the diode. The programming voltage has a magnitude sufficient to reverse bias the diode and to program the memory element. The memory element is readable in response to a read voltage being applied across the memory element and the diode. The read voltage has a magnitude sufficient to reverse bias the diode and insufficient to program the memory element.

In accordance with yet another aspect of the present invention, there is provided an integrated circuit memory device. The memory device includes an array of memory cells in a common well that are arranged in rows and columns. A plurality of electrically conductive row lines are provided, where each of the plurality of row lines couples memory cells in a respective row together. A plurality of electrically conductive column lines are provided, where each of the plurality of column lines couples memory cells in a respective column together. Each of the memory cells includes a memory element that is coupled in series with a diode between one of the plurality of row lines and one of the plurality of column lines. The diode has a breakdown voltage. The anode of the diode is coupled to receive a voltage from the one of the plurality of column lines, and the cathode of the diode is coupled to receive a voltage from the one of the plurality of row lines. The memory element is programmable in response to a programming voltage having a magnitude greater than the breakdown voltage being applied between the one of the plurality of row lines and the one of the plurality of column lines. The memory element is readable in response to a read voltage having a magnitude greater than the breakdown voltage and less than the programming voltage being applied between the one of the plurality of row lines and the one of the plurality of column lines.

In accordance with a further aspect of the present invention, there is provided an integrated circuit memory device. The memory device includes an array of memory cells in a common well that are arranged in rows and columns. A plurality of electrically conductive row lines are provided, where each of the plurality of row lines couples memory cells in a respective row together. A plurality of electrically conductive column lines are provided, where each of the plurality of column lines couples memory cells in a respective column together. Each of the memory cells includes a memory element coupled in series with a diode between one of the plurality of row lines and one of the plurality of column lines. The diode conducts a reverse current when the diode is reverse biased. The memory element is programmable in response to the reverse current having a first magnitude, and the memory element is readable in response to the reverse current having a second magnitude.

In accordance with a still further aspect of the present invention, there is provided an integrated circuit memory device. The memory device includes an array of memory cells in a common well that are arranged in rows and columns. A plurality of electrically conductive row lines are provided, where each of the plurality of row lines couples memory cells in a respective row together. A plurality of electrically conductive column lines are provided, where each of the plurality of column lines couples memory cells in a respective column together. Each of the memory cells includes a memory element coupled in series with a diode between one of the plurality of row lines and one of the plurality of column lines. The memory element is programmable in response to a programming voltage being applied between the one of the plurality of row lines and the one of the plurality of column lines. The programming voltage has a magnitude sufficient to reverse-bias the diode and to program the memory element. The memory element is readable in response to a read voltage being applied between the one of the plurality of row lines and the one of the plurality of column lines. The read voltage has a magnitude sufficient to reverse-bias the diode and insufficient to program the memory element.

In accordance with a yet further aspect of the present invention, there is provided a method of operating an integrated circuit memory device. The memory device has an array of memory cells in a common well being arranged in rows and columns. A plurality of electrically conductive row lines are provided, where each of the plurality of row lines couples memory cells in a respective row together. A plurality of electrically conductive column lines are provided, where each of the column lines couples memory cells in a respected column together. Each of the memory cells includes a memory element coupled in series with a diode between one of the plurality of row lines and one of the plurality of column lines. The diode has a breakdown voltage. The anode of the diode is coupled to receive the voltage from the one of the plurality of column lines, and the cathode of the diode is coupled to receive a voltage from the one of the plurality of row lines. The memory cell is programmed by applying a programming voltage between the one of the plurality of row lines and the one of the plurality of column lines. The programming voltage has a magnitude greater than the breakdown voltage. The memory cell is read by applying a read voltage between the one of the plurality of row lines and the one of the plurality of column lines. The read voltage has a magnitude greater than the breakdown voltage and less than the programming voltage.

In accordance with an even further aspect of the present invention, there is provided a method of operating an integrated circuit memory device. The memory device has an array of memory cells in a common well being arranged in rows and columns. A plurality of electrically conductive row lines are provided, where each of the plurality of row lines couples memory cells in a respective row together. A plurality of electrically conductive column lines are provided, where each of the plurality of column lines couples memory cells in a respective column together. Each of the memory cells includes a memory element coupled in series with a diode between one of the plurality of row lines and one of the plurality of column lines. The diode conducts a reverse current when the diode is reverse biased. The memory cell is programmed by applying a reverse current having a first magnitude through the memory cell from the one of the plurality of row lines to the one of the plurality of column lines. The memory cell is read by applying a reverse current having a second magnitude through the memory cell from the one of the plurality of row lines to the one of the plurality of column lines.

In accordance with another aspect of the present invention, there is provided a method of operating an integrated circuit memory device. The memory device has an array of memory cells in a common well being arranged in rows and columns. A plurality of electrically conductive row lines are provided, where each of the plurality of row lines couples memory cells in a respective row together. A plurality of electrically conductive column lines are provided, where each of the plurality of column lines couples memory cells in a respective column together. Each of the memory cells includes a memory element coupled in series with a diode between one of the plurality of row lines and one of the plurality of column lines. The memory cell is programmed by applying a programming voltage between the one of the plurality of row lines and the one of the plurality of column lines. The programming voltage has a magnitude sufficient to reverse-bias the diode and to program the memory element. The memory element is read by applying a read voltage between the one of the plurality of row lines and the one of the plurality of column lines. The read voltage has a magnitude sufficient to reverse-bias the diode and insufficient to program the memory element.

BRIEF DESCRIPTION OF THE DRAWINGS

The foregoing and other advantages of the invention will become apparent upon reading the following detailed description and upon reference to the drawings in which:

FIG. 15 illustrates a graph of diode current and substrate leakage current of a forward biased diode array; and FIG. 16 illustrates the diode current and substrate leakage current in a reversed biased diode array.

DETAILED DESCRIPTION OF SPECIFIC EMBODIMENTS

Figure 1:
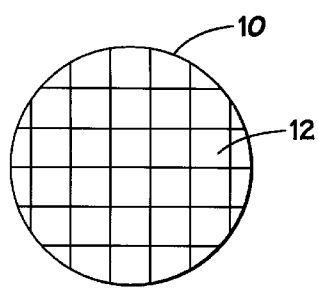
FIG. 1 illustrates a substrate, such as a semiconductor wafer, having a plurality of dies formed thereon.

Turning now to the drawings, and referring initially to FIG. 1, a semiconductor wafer is illustrated and generally designated by the reference numeral 10. The wafer 10 has been partitioned into a plurality of die 12. Typically, each of the die 12 contains an integrated circuit that is substantially identical to the integrated circuit contained by each of the other die 12 on the wafer 10.

Figure 2:
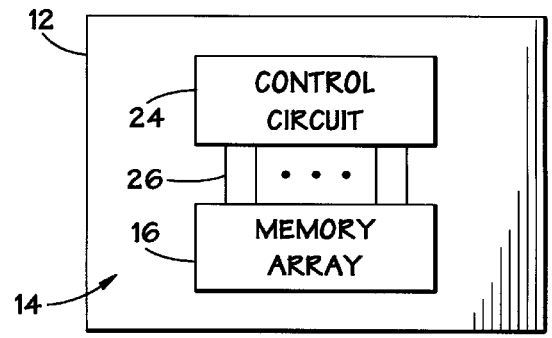
FIG. 2 illustrates an integrated circuit formed on a die of FIG. 1, where the integrated circuit includes a memory array and a control circuit.
Figure 3:
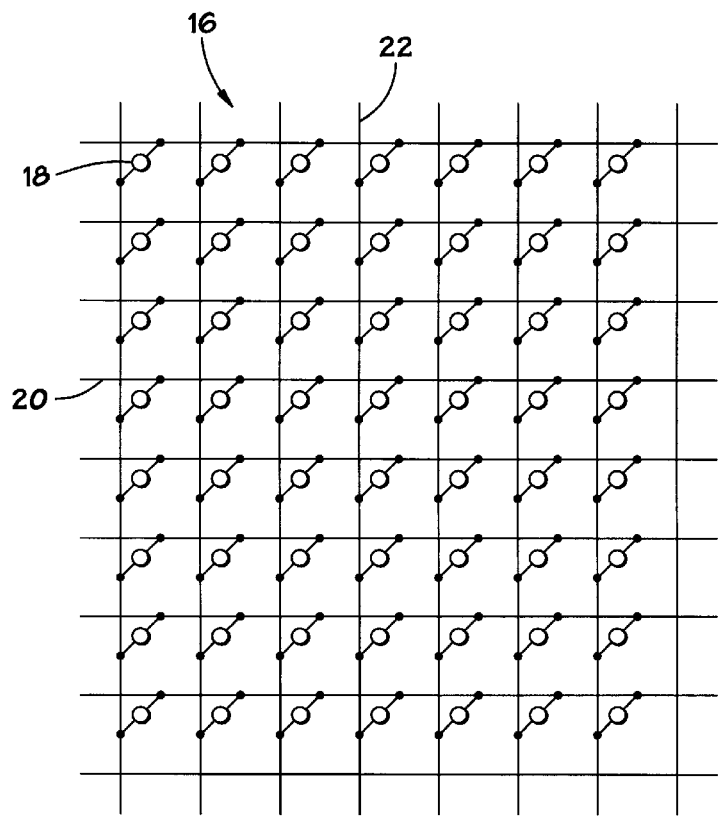
FIG. 3 illustrates an array of memory cells arranged in rows and columns.

Although a wide variety of integrated circuits may be formed on a die 12 of the wafer 10, in the embodiment illustrated in FIG. 2, a semiconductor memory device 14 is formed on the die 12. The memory device 14 generally includes a memory array 16. As illustrated in FIG. 3, the memory array 16 typically includes a plurality of memory cells 18 that are arranged in multiple rows and multiple columns. Each of the memory cells 18 is coupled to a respective row line 20 and to a respective column line 22. The memory device 14 also generally includes a control circuit 24 that is coupled to the memory array via one or more control lines 26. The control circuit 24 facilitates the addressing or selection of one or more memory cells 18 within the memory array so that information can be stored in and read from the memory cells 18.

Figure 4:
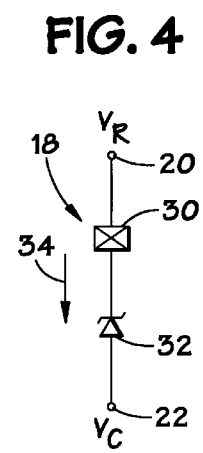
FIG. 4 illustrates an exemplary memory cell having a diode and a structure changing memory element.

This specific embodiment of the memory device 14 uses memory cells that include structure changing memory elements, such as chalcogenide resistors or antifuses. As illustrated in FIG. 4, a representative memory cell 18 includes a structure changing memory element 30 coupled to an access device, such as a diode 32. Advantageously, the diode 32 is a zener diode or an avalanche diode which is capable of passing a reverse current when reverse-biased. As illustrated in FIG. 4, the anode of the diode 32 is coupled to a column line and, thus, receives the column voltage $V_C$. The cathode of the diode 32 is coupled to the structure changing memory element 30. The structure changing memory element 30 is also coupled to a row line and, thus, receives the row voltage $V_R$. Of course, it should be understood that the positions of the diode 32 and the memory element 30 may be reversed. In this case, the cathode of the diode 32 is coupled to the row line and, thus, receives the row voltage $V_R$. The anode of the diode 32 is coupled to the structure changing memory element 30. The structure changing memory element 30 is also coupled to a column line and, thus, receives the column voltage $V_C$.

As will be discussed in detail below, when the voltage drop across the memory cell 18 from $V_R$ to $V_C$ is sufficient to overcome the breakdown voltage of the diode 32, which is typically about 3.0 volts to 4.0 volts, current may flow through the memory cell 18 in the direction of the arrow 34, depending upon the type of memory element 30 used. For instance, if the memory cell 18 is being used in a one time programmable read only memory, the memory element 30 may be an antifuse. To program an antifuse, the magnitude of the current flowing in the direction of the arrow 34 must be sufficient to breakdown the dielectric layer of the antifuse to create a current path through the memory cell 18. To read the contents of a memory cell 18 that uses an antifuse as a memory element 30, it is determined whether a current having a smaller magnitude flows through the memory cell 18. If the current flows through the memory cell 18, then the antifuse has been programmed. If the current does not flow through the memory cell 18, then the antifuse has not been programmed.

Alteratively, if a chalcogenide resistor is used as the memory element 30, the magnitude of the current flowing in the direction of the arrow 34 through the memory cell 18 is chosen to program the chalcogenide resistor in the desired manner. Thereafter, to read the contents of the memory cell 18, a current having a smaller magnitude than the programming current is passed through the memory cell 18. The magnitude of this current is sensed to determine the resistive state of the chalcogenide resistor.

Figure 5:
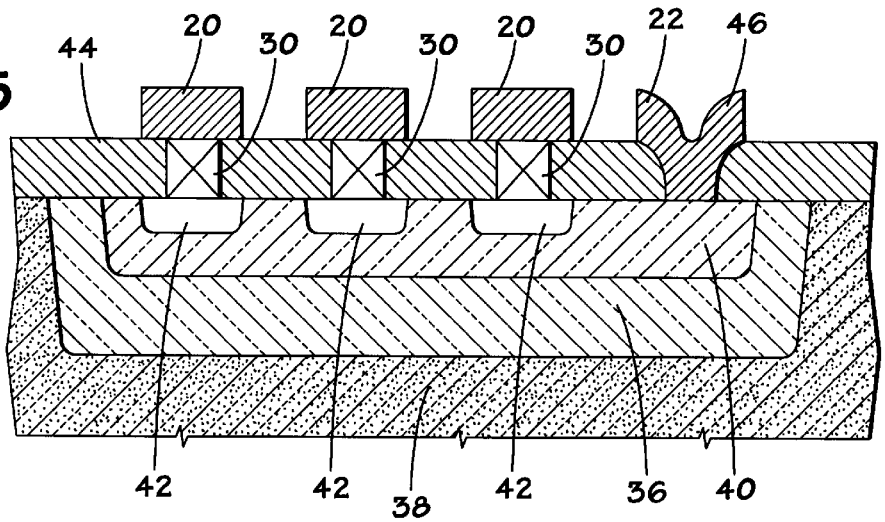
FIG. 5 illustrates a cross-sectional view of a semiconductor memory device illustrating a plurality of memory cells in a common semiconductor well.

Advantageously, the memory cells 18 are formed in a common semiconductor well, as illustrated by the more accurate depiction of a portion of the memory array 16 in FIG. 5. An n-doped well 36 is formed in a substrate 38. A p-doped layer 40 is formed in the n-doped well 36. The diodes 32 are formed by n+-doped regions 42 that are formed in the p-doped layer 40. The memory elements 30 are formed on top of the respective n+-doped regions 42. A dielectric or insulative layer 44 separates the memory elements 30 from one another. The row lines 20 are deposited on top of the respective memory elements 30. It should be recognized that the p-doped layer 40 in conjunction with a contact 46 forms a column line 22 that couples the memory cells 18 in the aligned rows together. Using this structure, a cell size of at least 0.4 microns by 0.4 microns should be ascertainable.

As mentioned previously, a chalcogenide resistor may be used as the memory element 30. A chalcogenide resistor is a structure changing memory element because its molecular order may be changed between an amorphous state and a crystalline state by the application of electrical current. In other words, a chalcogenide resistor is made of a state changeable material that can be switched from one detectable state to another detectable state or states. In state changeable materials, the detectable states may differ in their morphology, surface typography, relative degree of order, relative degree of disorder, electrical properties, optical properties, or combinations of one or more of these properties. The state of a state changeable material may be detected by the electrical conductivity, electrical resistivity, optical transmissivity, optical absorption, optical refraction, optical reflectivity, or a combination of these properties. In the case of a chalcogenide resistor specifically, it may be switched between different structural states of local order across the entire spectrum between the completely amorphous state and the completely crystalline state.

Figure 6:
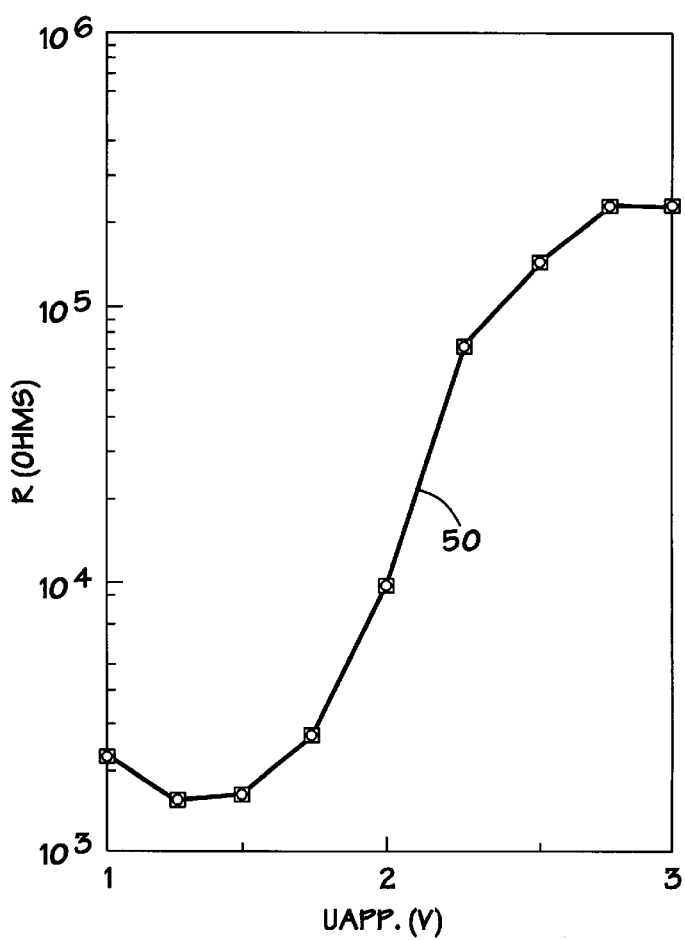
FIG. 6 illustrates a graph of applied voltage versus resistance for an exemplary chalcogenide memory element.

FIG. 6 is a graphical representation of the resistance of an exemplary chalcogenide resistor as a function of voltage applied across the resistor. As can be seen, the curve 50 clearly demonstrates the wide dynamic range of resistance values attainable, i.e., about two orders of magnitude, by a chalcogenide resistor. When the chalcogenide resistor is in its amorphous state, its resistance is relatively high. As the chalcogenide resistor changes to its crystalline state, its resistance decreases.

Low voltages, such as voltages in the range of 0 volts to about 0.9 volts in the illustrated example, do not alter the structure of the chalcogenide resistor. Higher voltages, such as voltages in the range of about 1.0 volts to about 3.0 volts in the illustrated example, may alter the structure of the chalcogenide resistor. Thus, to "program" a chalcogenide resistor, i.e., to place the chalcogenide resistor in a selected physical or resistive state, a selected voltage in the range of higher voltages is applied across the chalcogenide resistor. Once the state of the chalcogenide resistor has been set by the appropriate programming voltage, the state does not change until another programming voltage is applied to the chalcogenide resistor. Therefore, once the chalcogenide resistor has been programmed, a low voltage may be applied to the chalcogenide resistor to determine its resistance without changing its physical state.

in this example, if the chalcogenide resistor is used as a binary memory element 30, a logical 0 may be programmed by applying approximately 1.5 volts across the chalcogenide resistor, and a logical 1 may be programmed by applying approximately 2.7 volts across the chalcogenide resistor. Alternatively, if the chalcogenide resistor is to be used as a multi-state memory element 30, additional intermediate states may be programmed by applying intermediate voltages, such as about 2.0 volts and about 2.3 volts, across the chalcogenide resistor.

Figure 8:
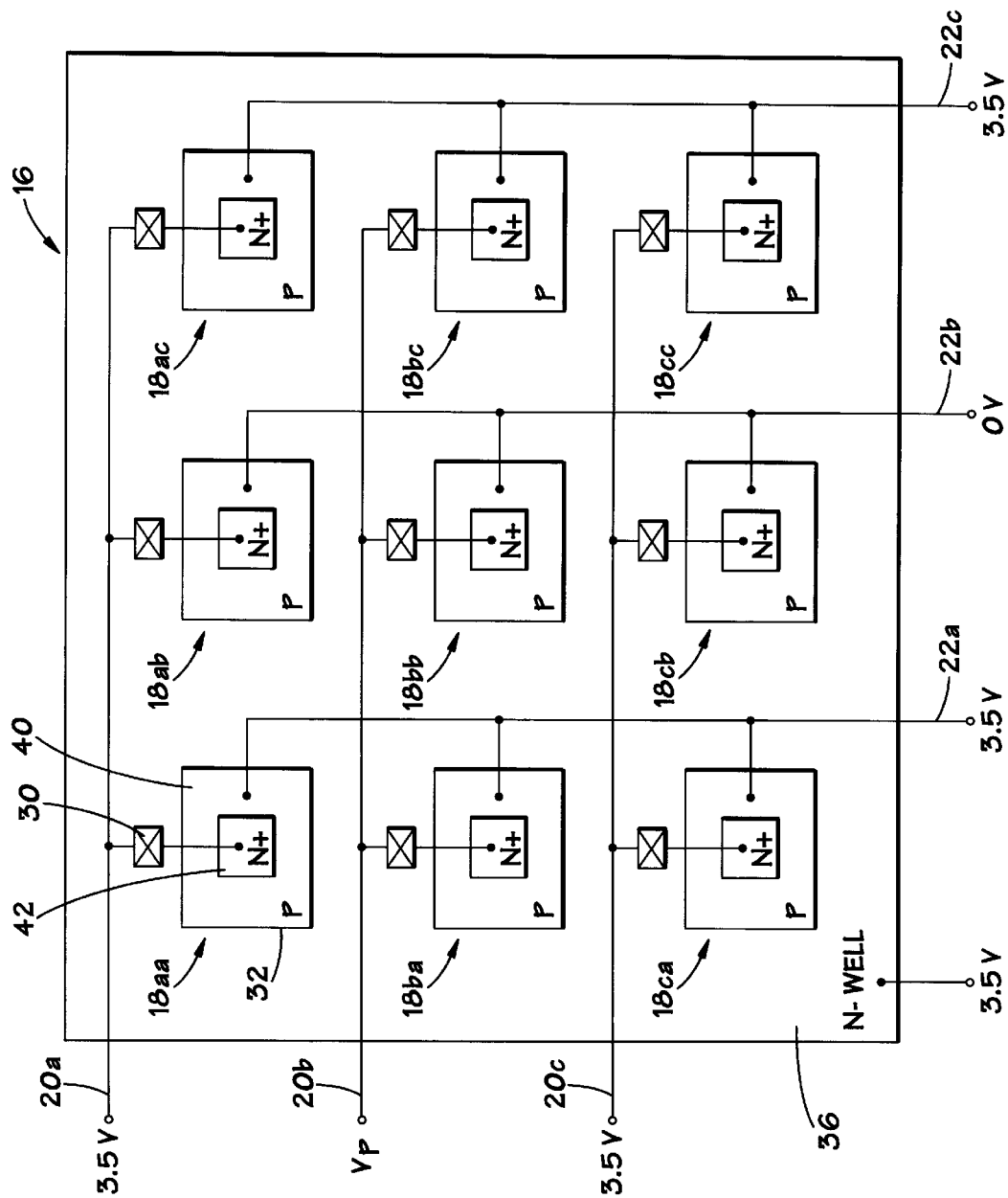
FIG. 8 illustrates a portion of a memory array in a common well in a programming mode.
Figure 9:
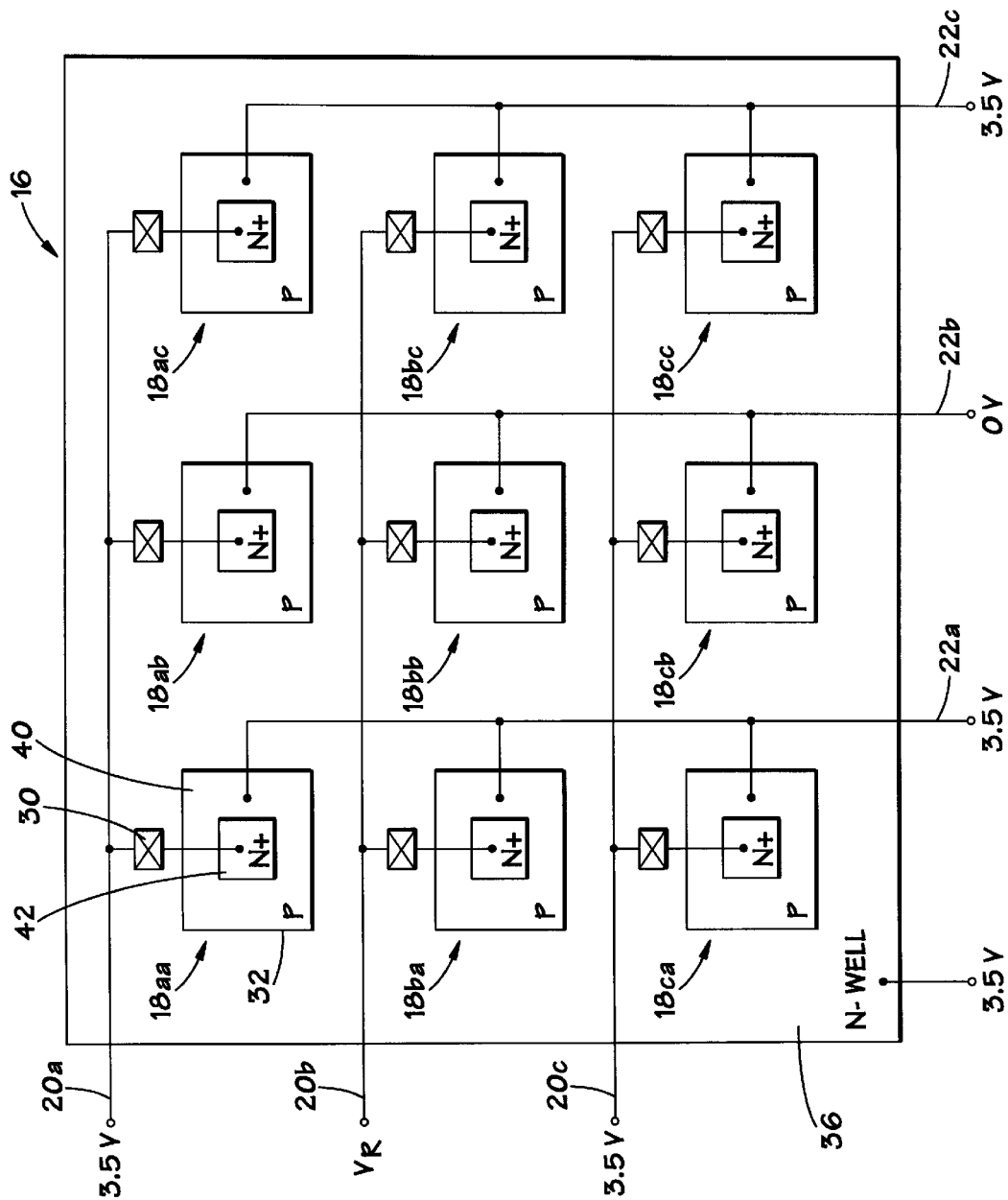
FIG. 9 illustrates a portion of a memory array in a common well in a reading mode.

The standby mode, programming mode, and reading mode of a reversed biased diode memory array will now be described in reference to FIGS. 7, 8, and 9 respectively. In this example, the programming and reading of a single memory cell is discussed. However, it should be understood that multiple memory cells may be programmed or read simultaneously by applying similar programming or reading voltages to multiple row lines and column lines.

In this example, the memory elements 30 are chalcogenide resistors having the properties illustrated by the curve 50 of FIG. 6, and the diodes 32 are zener diodes that have a breakdown voltage of about 4.0 volts. In FIGS. 7–9, the diodes 32 are illustrated as individual n+-doped regions 42 formed in individual p-doped layers 40. The diodes 32 are disposed in a common n-doped well 36, which is advantageously coupled to the standby voltage of 3.5 volts or greater. Although a 3×3 array of memory cells 18 is shown for purposes of describing the operation of the memory cells in the reversed biased diode array, it is believed that a sub-array of 16 million memory cells 18 may be formed in the common well 36, in a 4000×4000 array for instance, and that 4 to 128 sub-arrays may be formed on a single die 12.

Figure 7:
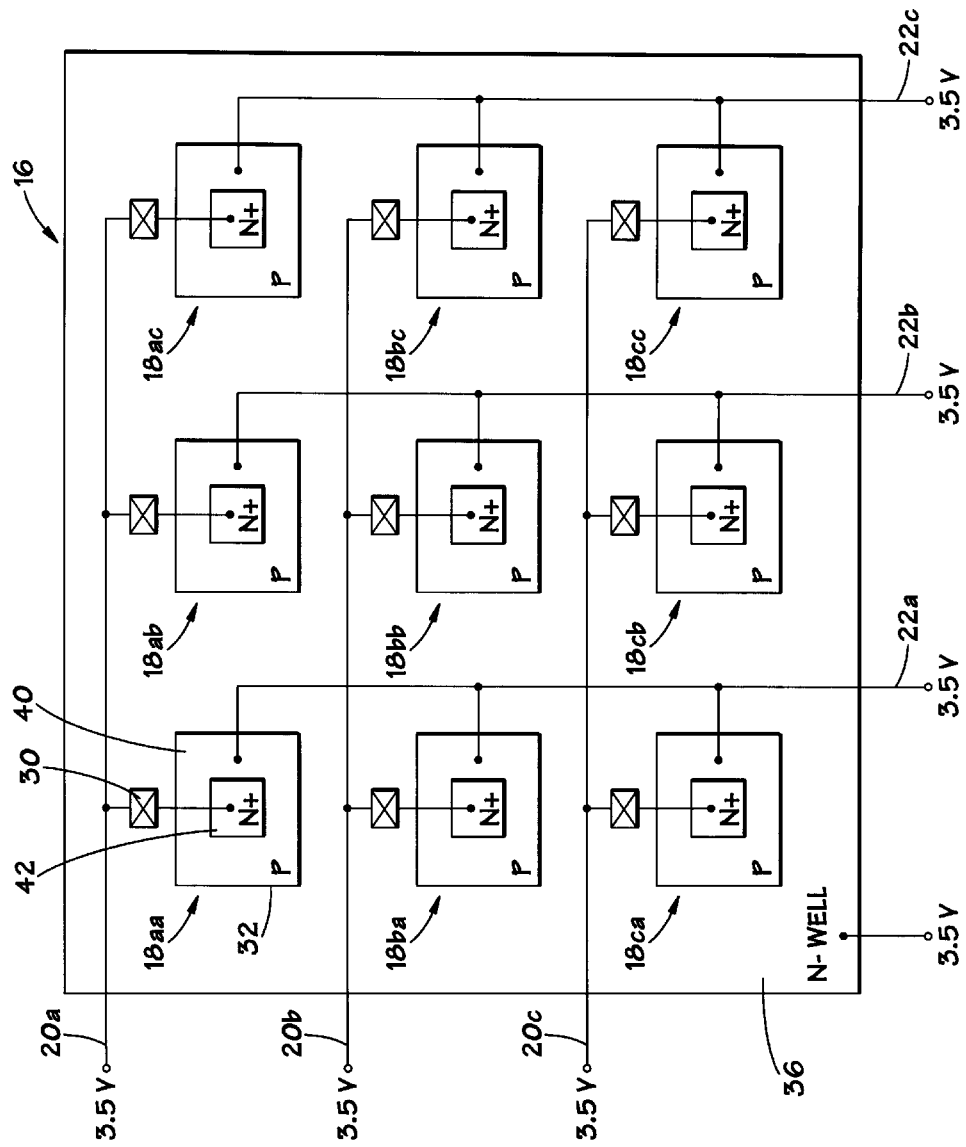
FIG. 7 illustrates a portion of a memory array in a common well in a standby mode.

In the standby mode illustrated in FIG. 7, a standby voltage $V_s$ of 3.5 volts is applied to the row lines 20a, 20b, and 20c and to the column lines 22a, 22b, and 22c. Because no voltage drops across any of the memory cells 18, the memory elements 30 can neither be read nor programmed. To program one of the memory cells 18, such as the central memory cell 18bb, a programming voltage $V_P$ is applied to its row line 20b, and the voltage of its column line 22b drops to 0 volts, as illustrated in FIG. 8. It should be noticed that the row lines 20a and 20c and the column lines 22a and 22c remain at a standby voltage of 3.5 volts.

Of course, just to overcome the reverse biased breakdown voltage of 4.0 volts on the zener diode 32, the programming voltage $V_P$ applied to the row line 20b must be at least 4.0 volts higher than the voltage applied to the column line 22b. As described previously with reference to the curve 50 of FIG. 6, the programming voltage $V_P$ should be sufficient to produce a voltage of between about 1.0 volts and 3.0 volts across the chalcogenide resistor that forms the memory element 30. In this example, therefore, a logical 0 may be programmed by a programming voltage $V_P$ of about 5.5 volts, and a logical 1 may be programmed by a program voltage $V_P$ of about 6.7 volts.

Once a memory element 30 has been programmed, the contents of the memory cell 18 may be read by applying a read voltage $V_R$ to the appropriate row line 20 and by dropping the voltage on the appropriate column line 22 to about 0 volts. The array 16 illustrated in FIG. 9 carries the present example further by illustrating such a read operation. In FIG. 9, the read voltage $V_R$ is applied to the row line 20b, and the voltage on the column line 22b is dropped from the standby voltage of 3.5 volts to about 0 volts. As before, because the breakdown voltage of the reversed biased diode 32 is about 4.0 volts, the read voltage $V_R$ applied to the row line 20b must be at least 4.0 volts greater than the voltage applied to the column line 22b. Continuing to use the curve 50 in this example, the read voltage $V_R$ may be about 4.5 volts to send a small current through the chalcogenide resistor that forms the memory element 30 so that its resistance, and thus its logical state, may be determined.

Figure 10:
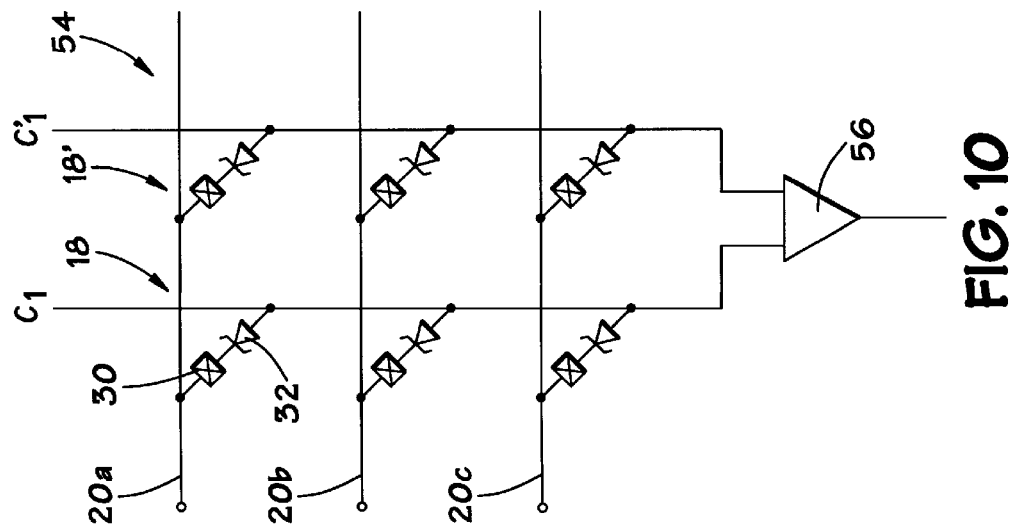
FIG. 10 illustrates a portion of a memory array coupled to a sense amplifier.

As will be explained in greater detail below, a reverse-biased diode memory array, such as the array 16 illustrated in FIGS. 7–9, leaks very little current to the substrate. However, the reverse-biased diodes 32 may leak some current during the programming and read operations. To improve the programming operation, a dual-cell array, such as the array 54 illustrated in FIG. 10, may be provided. In the dual-cell array 54, each memory location includes two memory cells 18 and 18' that are located in adjacent columns $C_1$ and $C_1'$. These adjacent cells 18 and 18' are programmed with the complement of one another to ensure that storage of the desired logical state. To improve the reading operation, a sense amplifier 56 is coupled to the column lines $C_1$ and $C_1'$ so that it senses twice the signal as compared to a single-cell array.

The standby voltage is selected to keep the diodes 32 of nonselected memory cells from turning on, i.e., conducting current, during programming or read operations. The operation of the memory cell 18bb during a programming operation and a read operation has been described above. Now, referring again to FIG. 8, the operation of other nonselected memory cells 18 will be described during the programming operation. First, it should be noted that the condition of the memory cells 18aa, 18ac, 18ca, and 18cc does not change during the programming operation, because the row lines 20a and 20c and the column lines 22a and 22c continue to carry the standby voltage of 3.5 volts.

Looking next to the nonselected memory cells 18ba and 18bc coupled to the selected row line 20b, it can be seen that these memory cells experience a voltage drop. However, the programming voltage $V_P$ would have to be at least 4.0 volts higher than the standby voltage of 3.5 volts on the respective column lines 22a and 22c in order to turn on the diodes 32 in the memory cells 18ba and 18bc. As described above, the magnitude of the programming voltage $V_P$ in this example is approximately 5.5 volts to program a logical 0 and approximately 6.7 volts to program a logical 1. Thus, the programming voltage $V_P$ will produce a voltage drop across the nonselected memory cells 18ba and 18bc of 2.0 volts or 3.2 volts, depending upon whether the selected memory cell 18bb is being programmed with a logical 0 or a logical 1. Since this voltage drop is not sufficient to overcome the reverse bias breakdown voltage of the diodes 32, the diodes 32 remain off and, thus, do not conduct current through the memory elements 30 of the memory cells 18ba and 18bc. Hence, the memory cells 18ba and 18bc remain in a standby mode.

Looking now at the nonselected memory cells 18ab and 18cb that are coupled to the selected column line 22b, it can be seen that these cells experience a voltage drop of 3.5 volts. Although the voltage on the selected column 22b drops from the standby voltage of 3.5 volts to 0 volts during programming, the voltage on the nonselected row lines 20a and 20c remains at the standby voltage of 3.5 volts. Because the voltage drop across the nonselected memory cells 18ab and 18cb is less than the 4.0 volts required to overcome the breakdown voltage of the diodes 32 of those memory cells, the diodes 32 remain off and, thus, do not conduct current through the memory elements 30 of the memory cells 18ab and 18cb. Hence, the memory cells 18ab and 18cb remain in a standby mode.

Figure 11:
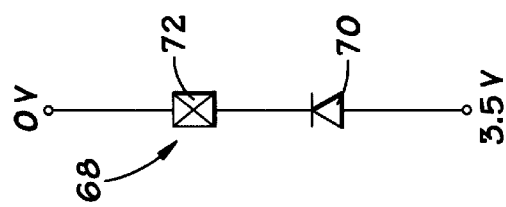
FIG. 11 illustrates an exemplary memory cell used in a forward biased diode array.

As mentioned previously, the problem of latch up limits the density at which memory cells may be fabricated in a forward biased diode array. This problem is caused because of the striking physical similarities between the diode and a bipolar junction transistor (BJT). Although the diode does not generally act like a BJT, as the density of memory cells increases in a forward biased diode array, parasitic BJT action involving carrier multiplication and regenerative feedback leads to latch up failure. FIG. 11 illustrates a memory cell 68 used in a forward biased diode array. The diode 70 is coupled to a memory element 72. When operating in a forward biased mode, the anode of the diode 70 receives a voltage having a magnitude greater than the voltage at the cathode of the diode 70.

Figure 12:
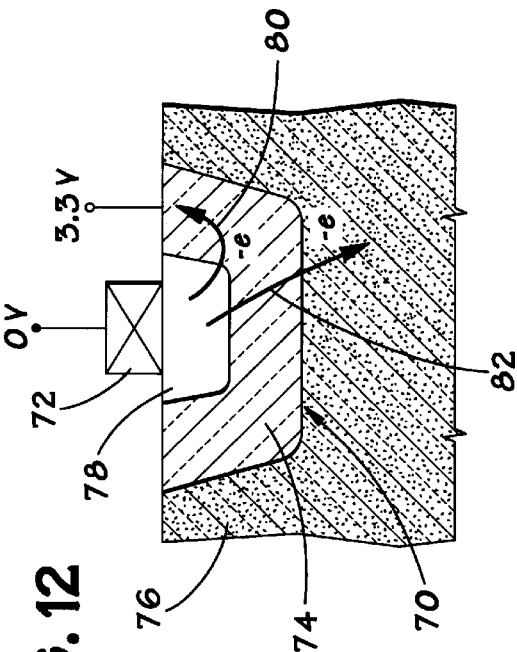
FIG. 12 illustrates a cross-sectional view of a memory cell of a forward biased diode array in latch up mode.

FIG. 12 illustrates the effect of operating a memory cell 68 in the forward biased mode. As illustrated in FIG. 12, a p-type area 74 is formed in an n-type substrate 76. To form the diode 70, an n-type area 78 is formed in the p-type area 74. To complete the memory cell 68, the memory element 72 is coupled to the n-type area 78. When operating in the forward biased mode, during a programming cycle, for instance, the n-type substrate 76 is coupled to 3.3 volts, as is the p-type area 74, i.e., the anode of the diode 70. The memory element 72 is coupled to 0 volts. The programming voltage is about 3.3. volts because about 0.6 volts is need to overcome the threshold voltage of the forward-biased diode, and about 2.7 volts is needed to program the memory element. In the p-type area 74, electrons are minority carriers, and, thus, the structure forms a classic n-p-n BJT. As can be seen, electrons not only flow in the direction of the arrow 80, but also in the direction of the arrow 82 into the substrate 76. When this electron flow into the substrate is multiplied by other memory cells in close proximity in the array, the substrate 76 basically becomes saturated, thus producing a domino effect that causes many other BJTs in the array to turn on.

Figure 13:
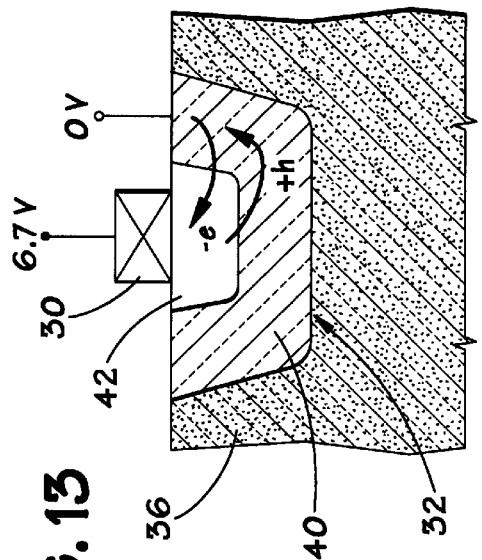
FIG. 13 illustrates a cross-sectional view of carrier flow in a reversed biased diode array.

The diode 32 used in the reverse biased diode memory array 16 does not suffer from latch up failure. As illustrated in FIG. 13, during a programming operation, for instance, 6.7 volts may be applied to the memory element 30, and 0 volts may be applied to the anode of the diode 32. Using the same reference numerals previously set forth in reference to FIG. 5, the diode 32 is formed by fabricating a p-type area 40 in an n-type well 36 and by further fabricating an n+type area 42 in the p-type area 40. In the programming mode, because of the reverse bias, holes become the majority carriers in the p-type area 40. Thus, very little current leaks into the substrate 36.

Figure 14:
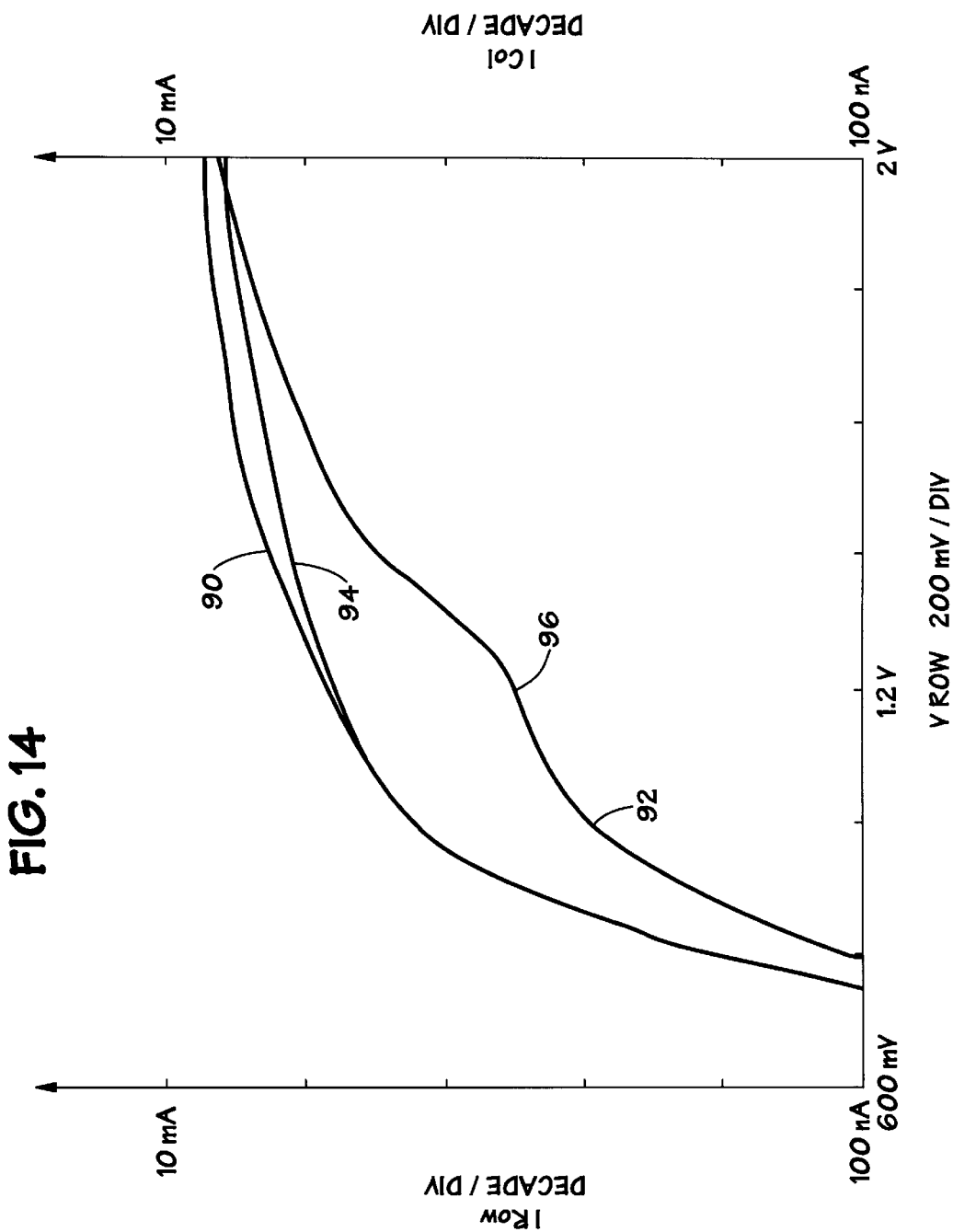
FIG. 14 illustrates a graph of row current, column current, and substrate current of a forward biased diode array that shows the onset of latch up.

To illustrate the onset of a latch up condition in a forward biased diode array, FIG. 14 contains two curves 90 and 92 which illustrate the row current and column current, respectively, as function of voltage. FIG. 13 also contains a third curve 94 that illustrates the substrate current as a function of voltage. As can be seen, the curves 90 and 94, which illustrate the row current and substrate current, respectively, are essentially equal. This means that most of the row current flows directly to the substrate. As illustrated on the curve 92, latch up begins to occur at the point 96, as shown by the sharp rise in the standby column current.

To demonstrate a more direct comparison between a forward biased diode array and a reverse biased diode array, identical 5×10 arrays were formed having a density of approximately one cell per 4 square microns. As illustrated in FIG. 15, the current flowing through the diode as a function of voltage is shown by the curve 100, and the current flowing to the substrate as a function of voltage is shown by the curve 102. As can be seen, the largest difference between the diode current and the substrate current is approximately 10 micro amps.

Conversely, as illustrated in FIG. 16, a curve 104 shows the current flowing through a diode 32 as a function of voltage, and a curve 106 shows the current flowing through the substrate as a function of voltage. A comparison of the curve 104 with the curve 106 at any point demonstrates that the current through the diode 32 is much greater than the current leaking through the substrate. By way of a specific example, a point 108 on the curve 104 and a point 110 on the curve 106 indicate the current at a voltage of 2.1 volts, which corresponds to a programming voltage $V_P$ of about 6.1 volts in the previous example. At the point 108, the current flowing through the diode 32 is 45.6 micro amps, while at the point 110 the current flowing through to the substrate is 0.58 micro amps. Thus, more than eighty times more current flows through the diode 32 than leaks to the substrate in the reverse biased diode memory array.

While the present invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A memory cell for use in an integrated circuit memory device, said memory cell comprising:

a memory element; and a diode having a breakdown voltage and being coupled to said memory element, said memory element being programmable in response to a programming voltage having a magnitude greater than said breakdown voltage being applied across said memory element and said diode, and said memory element being readable in response to a read voltage having a magnitude greater than said breakdown voltage and less than said programming voltage being applied across said memory element and said diode.

2. The memory cell, as set forth in claim 1, wherein said memory element comprises a material that changes from a first state to a second state in response to said programming voltage.

3. The memory cell, as set forth in claim 1, wherein said memory element comprises a chalcogenide material that changes from a first state to a second state in response to said programming voltage.

4. The memory cell, as set forth in claim 1, wherein said memory element comprises an antifuse.

5. The memory cell, as set forth in claim 1, wherein said diode comprises a zener diode.

6. The memory cell, as set forth in claim 1, wherein said diode comprises an avalanche diode.

7. The memory cell, as set forth in claim 1, wherein said programming voltage reverse-biases said diode and causes a current to flow through said diode and said memory element, said current having a magnitude sufficient to program said memory element.

8. The memory cell, as set forth in claim 1, wherein said read voltage reverse-biases said diode and causes a current to flow through said diode and said memory element, said current having a magnitude insufficient to program said memory element.

9. A memory cell for use in an integrated circuit memory device, said memory cell comprising:

a memory element; and a diode coupled to said memory element for conducting a reverse current when said diode is reverse biased, said memory element being programmable in response to said reverse current having a first magnitude and said memory element being readable in response to said reverse current having a second magnitude.

10. The memory cell, as set forth in claim 9, wherein said memory element comprises a material that changes from a first state to a second state in response to said reverse current having said first magnitude.

11. The memory cell, as set forth in claim 9, wherein said memory element comprises a chalcogenide material that changes from a first state to a second state in response to said reverse current having said first magnitude.

12. The memory cell, as set forth in claim 9, wherein said memory element comprises an antifuse.

13. The memory cell, as set forth in claim 9, wherein said diode comprises a zener diode.

14. The memory cell, as set forth in claim 9, wherein said diode comprises an avalanche diode.

15. A memory cell for use in an integrated circuit memory device, said memory cell comprising:

a memory element; and a diode being coupled to said memory element, said memory element being programmable in response to a programming voltage being applied across said memory element and said diode, said programming voltage having a magnitude sufficient to reverse-bias said diode and to program said memory element, and said memory element being readable in response to a read voltage being applied across said memory element and said diode, said read voltage having a magnitude sufficient to reverse-bias said diode and insufficient to program said memory element.

16. The memory cell, as set forth in claim 15, wherein said memory element comprises a material that changes from a first state to a second state in response to said programming voltage.

17. The memory cell, as set forth in claim 15, wherein said memory element comprises a chalcogenide material that changes from a first state to a second state in response to said programming voltage.

18. The memory cell, as set forth in claim 15, wherein said memory element comprises an antifuse.

19. The memory cell, as set forth in claim 15, wherein said diode comprises a zener diode.

20. The memory cell, as set forth in claim 15, wherein said diode comprises an avalanche diode.

21. The memory cell, as set forth in claim 15, wherein said programming voltage causes a current to flow through said diode and said memory element, said current having a magnitude sufficient to program said memory element.

22. The memory cell, as set forth in claim 15, wherein said read voltage causes a current to flow through said diode and said memory element, said current having a magnitude insufficient to program said memory element.

23. An integrated circuit memory device comprising:

an array of memory cells in a common well being arranged in rows and columns;

a plurality of electrically conductive row lines, each of said plurality of row lines coupling memory cells in a respective row together; and a plurality of electrically conductive column lines, each of said plurality of column lines coupling memory cells in a respective column together;

wherein each of said memory cells comprises:

a memory element being coupled in series with a diode between one of said plurality of row lines and one of said plurality of column lines, said diode having a breakdown voltage and having an anode coupled to receive a voltage from said one of said plurality of column lines and having a cathode coupled to receive a voltage from said one of said plurality of row lines, said memory element being programmable in response to a programming voltage having a magnitude greater than said breakdown voltage being applied between said one of said plurality of row lines and said one of said plurality of column lines, and said memory element being readable in response to a read voltage having a magnitude greater than said breakdown voltage and less than said programming voltage being applied between said one of said plurality of row lines and said one of said plurality of column lines.

24. The memory device, as set forth in claim 23, wherein said memory element comprises a material that changes from a first state to a second state in response to said programming voltage.

25. The memory device, as set forth in claim 23, wherein said memory element comprises a chalcogenide material that changes from a first state to a second state in response to said programming voltage.

26. The memory device, as set forth in claim 23, wherein said memory element comprises an antifuse.

27. The memory device, as set forth in claim 23, wherein said diode comprises a zener diode.

28. The memory device, as set forth in claim 23, wherein said diode comprises an avalanche diode.

29. The memory device, as set forth in claim 23, wherein said programming voltage reverse-biases said diode and causes a current to flow through said diode and said memory element, said current having a magnitude sufficient to program said memory element.

30. The memory device, as set forth in claim 23, wherein said read voltage reverse-biases said diode and causes a current to flow through said diode and said memory element, said current having a magnitude insufficient to program said memory element.

31. An integrated circuit memory device comprising:

an array of memory cells in a common well being arranged in rows and columns;

a plurality of electrically conductive row lines, each of said plurality of row lines coupling memory cells in a respective row together; and a plurality of electrically conductive column lines, each of said plurality of column lines coupling memory cells in a respective column together;

wherein each of said memory cells comprises:

a memory element coupled in series with a diode between one of said plurality of row lines and one of said plurality of column lines, said diode conducting a reverse current when said diode is reverse biased, said memory element being programmable in response to said reverse current having a first magnitude and said memory element being readable in response to said reverse current having a second magnitude.

32. The memory device, as set forth in claim 31, wherein said memory element comprises a material that changes from a first state to a second state in response to said reverse current having said first magnitude.

33. The memory device, as set forth in claim 31, wherein said memory element comprises a chalcogenide material that changes from a first state to a second state in response to said reverse current having said first magnitude.

34. The memory device, as set forth in claim 31, wherein said memory element comprises an antifuse.

35. The memory device, as set forth in claim 31, wherein said diode comprises a zener diode.

36. The memory device, as set forth in claim 31, wherein said diode comprises an avalanche diode.

37. An integrated circuit memory device comprising:

an array of memory cells in a common well being arranged in rows and columns;

a plurality of electrically conductive row lines, each of said plurality of row lines coupling memory cells in a respective row together; and a plurality of electrically conductive column lines, each of said plurality of column lines coupling memory cells in a respective column together;

wherein each of said memory cells comprises:

a memory element coupled in series with a diode between one of said plurality of row lines and one of said plurality of column lines, said memory element being programmable in response to a programming voltage being applied between said one of said plurality of row lines and said one of said plurality of column lines, said programming voltage having a magnitude sufficient to reverse-bias said diode and to program said memory element, and said memory element being readable in response to a read voltage being applied between said one of said plurality of row lines and said one of said plurality of column lines, said read voltage having a magnitude sufficient to reverse-bias said diode and insufficient to program said memory element.

38. The memory device, as set forth in claim 37, wherein said memory element comprises a material that changes from a first state to a second state in response to said programming voltage.

39. The memory device, as set forth in claim 37, wherein said memory element comprises a chalcogenide material that changes from a first state to a second state in response to said programming voltage.

40. The memory device, as set forth in claim 37, wherein said memory element comprises an antifuse.

41. The memory device, as set forth in claim 37, wherein said diode comprises a zener diode.

42. The memory device, as set forth in claim 37, wherein said diode comprises an avalanche diode.

43. The memory device, as set forth in claim 37, wherein said programming voltage causes a current to flow through said diode and said memory element, said current having a magnitude sufficient to program said memory element.

44. The memory device, as set forth in claim 37, wherein said read voltage causes a current to flow through said diode and said memory element, said current having a magnitude insufficient to program said memory element.

45. A method of operating an integrated circuit memory device, said memory device having an array of memory cells in a common well being arranged in rows and columns, a plurality of electrically conductive row lines, each of said plurality of row lines coupling memory cells in a respective row together, a plurality of electrically conductive column lines, each of said plurality of column lines coupling memory cells in a respective column together, wherein each of said memory cells comprises a memory element coupled in series with a diode between one of said plurality of row lines and one of said plurality of column lines, said diode having a breakdown voltage and having an anode coupled to receive a voltage from said one of said plurality of column lines and having a cathode coupled to receive a voltage from said one of said plurality of row lines, said method comprising the steps of:

(a) programming said memory cell by applying a programming voltage between said one of said plurality of row lines and said one of said plurality of column lines, said programming voltage having a magnitude greater than said breakdown voltage; and (b) reading said memory cell by applying a read voltage between said one of said plurality of row lines and said one of said plurality of column lines, said read voltage having a magnitude greater than said breakdown voltage and less than said programming voltage.

46. A method of operating an integrated circuit memory device, said memory device having an array of memory cells in a common well being arranged in rows and columns, a plurality of electrically conductive row lines, each of said plurality of row lines coupling memory cells in a respective row together, a plurality of electrically conductive column lines, each of said plurality of column lines coupling memory cells in a respective column together, wherein each of said memory cells comprises a memory element coupled in series with a diode between one of said plurality of row lines and one of said plurality of column lines, said diode conducting a reverse current when said diode is reverse biased, said method comprising the steps of:

(a) programming said memory cell by applying a reverse current having a first magnitude through said memory cell from said one of said plurality of row lines to said one of said plurality of column lines; and (b) reading said memory cell by applying a reverse current having a second magnitude through said memory cell from said one of said plurality of row lines to said one of said plurality of column lines.

47. A method of operating an integrated circuit memory device, said memory device having an array of memory cells in a common well being arranged in rows and columns, a plurality of electrically conductive row lines, each of said plurality of row lines coupling memory cells in a respective row together, a plurality of electrically conductive column lines, each of said plurality of column lines coupling memory cells in a respective column together, wherein each of said memory cells comprises a memory element coupled in series with a diode between one of said plurality of row lines and one of said plurality of column lines, said method comprising the steps of:

(a) programming said memory cell by applying a programming voltage between said one of said plurality of row lines and said one of said plurality of column lines, said programming voltage having a magnitude sufficient to reverse-bias said diode and to program said memory element; and (b) reading said memory cell by applying a read voltage between said one of said plurality of row lines and said one of said plurality of column lines, said read voltage having a magnitude sufficient to reverse-bias said diode and insufficient to program said memory element.

\* \* \* \* \*